United States Patent [19]
Mouret

[11] Patent Number: 5,181,035
[45] Date of Patent: Jan. 19, 1993

[54] INTERPOLATION ANALOG/DIGITAL CONVERTER

[75] Inventor: Michel Mouret, Jarry, France

[73] Assignee: SGS-Thomson Microelectronics S.A., Gentilly, France

[21] Appl. No.: 748,213

[22] Filed: Aug. 21, 1991

[30] Foreign Application Priority Data

Aug. 21, 1990 [FR] France .................... 90 10739

[51] Int. Cl.$^5$ .............................................. H03M 1/38
[52] U.S. Cl. ..................................... 341/161; 341/159
[58] Field of Search ..................... 341/156, 159, 161

[56] References Cited

U.S. PATENT DOCUMENTS

| 4,591,830 | 5/1986 | Hanna | 341/159 |
| 4,599,602 | 7/1986 | Matzuzawa et al. | 341/161 |
| 4,774,498 | 9/1988 | Traa | 341/159 |
| 4,928,103 | 5/1990 | Lane | 341/159 |
| 4,940,980 | 7/1990 | Tice | 341/159 |

OTHER PUBLICATIONS

IEEE Journal of Solid-State Circuits, "An 8-Bit Video ADC Incorporating Folding and Interpolation Techniques", SC-22, No. 6, Dec. 1987, pp. 944-953.

*Primary Examiner*—Marc Hoff
*Attorney, Agent, or Firm*—Lowe, Price, LeBlanc & Becker

[57] ABSTRACT

An N-bit interpolation analog/digital circuit comprises a first stage of p comparators ($C_1 \ldots C_p$). The outputs of the comparators are combined in a plurality of groups, which are connected so that the combined output ($S_{1a}$, $S_{1b}$) of each group has the shape of a signal periodically varying between high and low levels. The output voltages of each group are compared close to their zero crossings in second stages ($I_1 \ldots I_r$) of $q+1$ comparators each ($p[q+1]=2^N$). Each comparator of the first stage is a high linearity comparator comprising two legs each comprising a first and a second transistor ($T_{101}$, $T_{102}$; $T_{103}$, $T_{104}$). The base of the second transistor of each leg is connected at the junction node of the transistors of the other leg through a voltage shifting means ($E_1$, $E_2$), and the emitters of the second transistors of each leg are interconnected through a resistor (RES).

7 Claims, 5 Drawing Sheets

INTERPOLATION ANALOG/DIGITAL CONVERTER

BACKGROUND OF THE INVENTION

The present invention relates to high-speed analog/digital converters and more particularly to interpolation-type analog/digital converters.

FIG. 1 very schematically shows the general architecture of an N-bits interpolation analog/digital converter.

The input analog value $V_e$ is compared in p input comparators $C_1 \ldots C_i \ldots C_p$ to reference voltages supplied, for example, by a stepped resistor bridge $r_i$. The output voltages $s_i$ of comparators $C_i$ are combined into r groups: the output $s_i$ of comparator $C_i$ with outputs $s_{i-r}, s_{i-2r} \ldots$ and $s_{i+r}, s_{i+2r} \ldots$ and, similarly, the output $s_{i+1}$ of comparator $C_{i+1}$ with outputs $s_{i+1+r}, s_{i+1+2r}, \ldots$, and $s_{i+1-r}, s_{i+1-2r} \ldots$, etc., for providing the combined outputs $S_1 \ldots S_r$. Each of the r combined outputs $S_1 \ldots S_r$ results from folding as will be explained in relation with FIG. 2, and is then applied to r interpolation circuits $I_1 \ldots I_r$, each of which achieves interpolation in q+1 voltage sub intervals, each of which corresponds to the division by q+1 of the interval between the reference voltages applied to two successive comparators $C_i$. The outputs $s_i$ of comparators $C_i$ and the interpolator outputs $I_1 - I_r$ are applied to a storage and coding circuit 10 to supply to the output conductors a digital value corresponding to the amplitude of the input analog signal. Such a converter is for example described in "An 8-bit 50 MHz Video ADC with folding and interpolation techniques", R. Van de Grift et al, pages 94-95, ISSCC 87.

With p input comparators and q interpolations, an N-bits analog/digital converter is achieved such that $2^N = p(q+1)$ by reducing the total number of comparators which, instead of being equal to $2^N$, is equal to p(input comparators)+r(q+1) (interpolation comparators). Since r is generally relatively low, this leads, as soon as the bit number, N, of the analog/digital converter goes high, for example higher than 8, to substantially reduce the number of input comparators, this reduction in the number of input comparators being well over the number of the additional comparators required in the r interpolation circuits.

FIG. 2 shows a conventional exemplary implementation and combination of successive comparators of a same group among the r groups of comparators. It is assumed that r is equal to 4 and FIG. 2 shows the successive comparators $C_1, C_5, C_9, C_{13} \ldots$. Each comparator comprises in the given example two NPN transistors, the emitters of which are interconnected and connected to the ground through a current source $I_1$. The base of the first transistor receives input voltage and the base of the second transistor receives the reference voltage corresponding to this comparator. The collector of the first transistor ($T_{11}, T_{51}, T_{91}, T_{131}$), of each comparator is connected to a high supply terminal through a resistor R and the signal on this collector is copied by an NPN transistor ($T_1, T_5, T_9, T_{13} \ldots$), the collector of which is connected to a high voltage source and the emitter forms the output terminal $S_1$. In fact, FIG. 2 shows two output lines $S_{1a}$ and $S_{1b}$ grounded through current sources $I_2$, each of which is connected to every two transistors, so that quasi-complementary signals are obtained on lines $S_{1a}$ and $S_{1b}$. The collector of the second transistor ($T_{12}, T_{52}, T_{92}, T_{132}$) of each comparator is connected to the collector of the first transistor of the next comparator. Thus, the collector of the second transistor $T_{12}$ of comparator $C_1$ is connected to the collector of the first transistor $T_{51}$ of comparator $C_5 \ldots$.

FIG. 3 shows the evolution of signal $S_{1a}$ as a function of the input voltage $V_e$.

When $V_e$ is lower than $V_1$, transistors $T_{11}, T_{51}, T_{91}, T_{131}$ are off while transistors $T_{12}, T_{52}, T_{92}, T_{132}$ are on. Transistor $T_{11}$ being off, transistor $T_1$ has its base set to "1", causing line $S_{1a}$ to go high. On the contrary, transistors $T_5, T_{13}, \ldots$, the bases of which are at a low level because of the conductive state of transistors $T_{12}, T_{52}, T_{92} \ldots$ impose a low level on line $S_{1b}$.

When voltage $V_e$ ranges from $V_1$ to $V_5$, transistor $T_{11}$ is on. Therefore, the base of transistor $T_1$ is at a low level. Transistors $T_{12}$ and $T_{51}$ are slightly conductive, then the base of transistor $T_5$ is therefore at a high level and line $S_{1b}$ goes high and the bases of transistors $T_{52}, T_{92}, T_{132} \ldots$, remain at a low level. Thus, except for the base of transistor $T_5$, all the bases of transistors $T_1, T_9, T_{13} \ldots$ are at a low level and line $S_{1a}$ is at a low level. Then, the voltage on line $S_{1a}$ alternatively goes at a low and high level as the voltage $V_e$ increases. The signal changes its state close to each voltage $V_1, V_5, V_9, V_{13} \ldots$. Interpolation is achieved in this area.

The interpolation will be preferably achieved by using signal $S_{1a}$ and its quasi-complementary signal $S_{1b}$.

Still assuming that r is equal to 4, that is, four outputs $S_1, S_2, S_3$ and $S_4$ of the input comparators are applied to the interpolation circuits $I_1 \ldots I_4$, FIG. 4A shows the shape of outputs $S_1-S_4$ and more particularly outputs $S_{1a}-S_{4a}$ and FIG. 4B shows the shape of curves $S_{1a}$ and $S_{2a}$ close to voltages $V_1$ and $V_2$. The interpolations are achieved close to these changes of state in interpolators $I_1 \ldots I_r$. However, the differential stage used, as shown in FIG. 2, is highly non linear. As a result, on the one hand, voltages $V_1$ and $V_2$ must not be too different and, on the other, it is not possible to increase the number of interpolation points, 4 seeming to be a maximum.

But, it appears that, if it is desired to decrease the number of comparators, and therefore the surface and consumption of an analog/digital converter, it would be suitable, when the number of bits that is desired to obtain is high, for example equal to 10, to increase the number of interpolation levels of each interpolator.

SUMMARY OF THE INVENTION

The invention teaches that this object can be achieved by modifying the input comparison/combination circuits for obtaining a linear characteristic of each of these comparison/combination circuits.

More particularly, the invention provides an N-bits interpolation analog/digital converter comprising a first stage of p comparators, the outputs of which are associated by groups of comparators shifted by a determined increment r, the combined output of each group being in the form of a signal periodically varying between high and low levels, the output voltages of each group being compared close to their transition state in second stages of q+1 comparators (p[q+1]=$2^N$). Each first stage comparator is a high linearity comparator comprising two legs each of which includes a first and a second transistor, the base of the second transistor of each leg is connected to the junction of the transistors of the other leg through a voltage shifting means, and the emitters of the second transistors of each leg being interconnected through a resistor.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1:
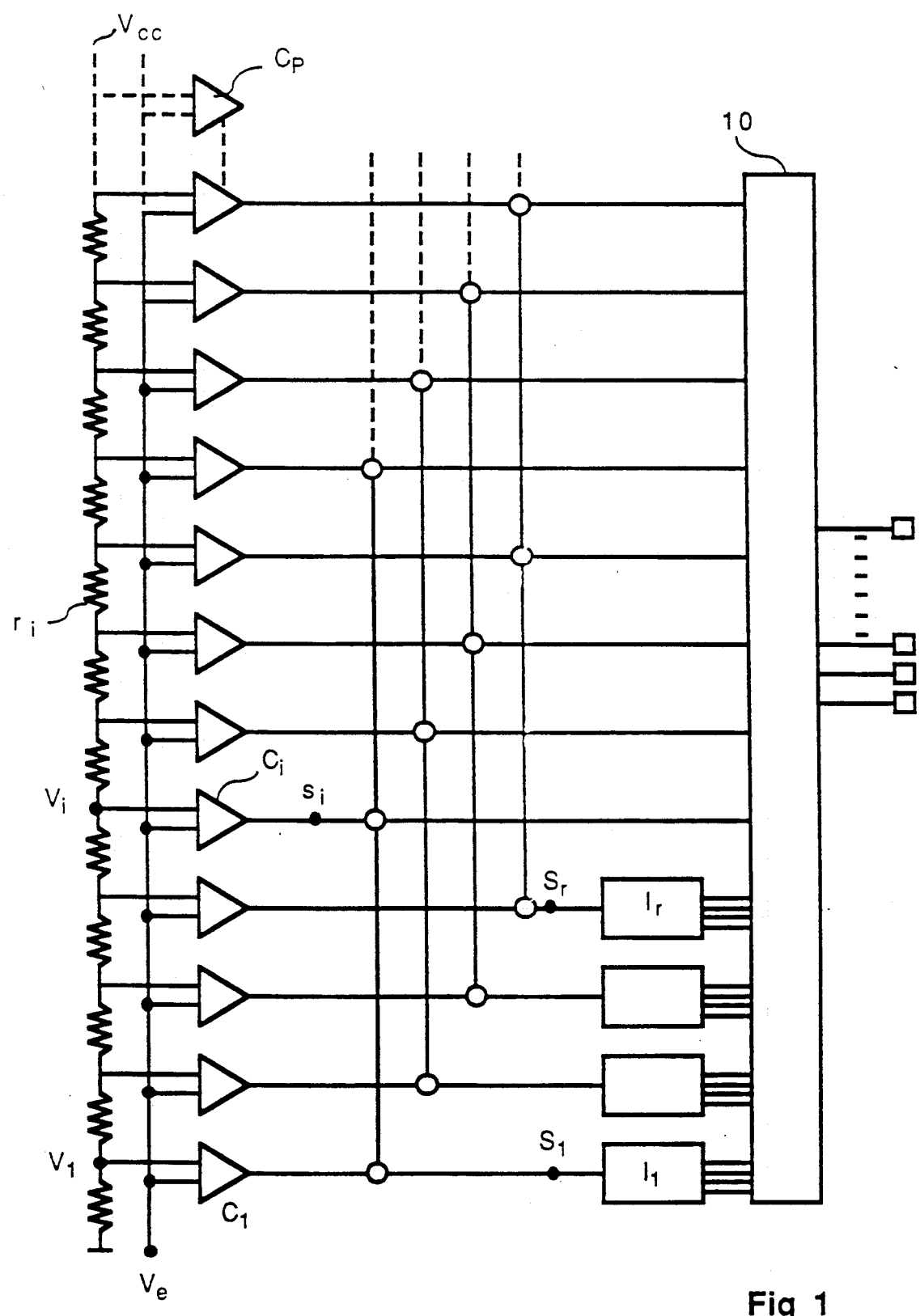
FIG. 1, above described, shows the general architecture of a conventional interpolation analog/digital circuit.
Figure 2:
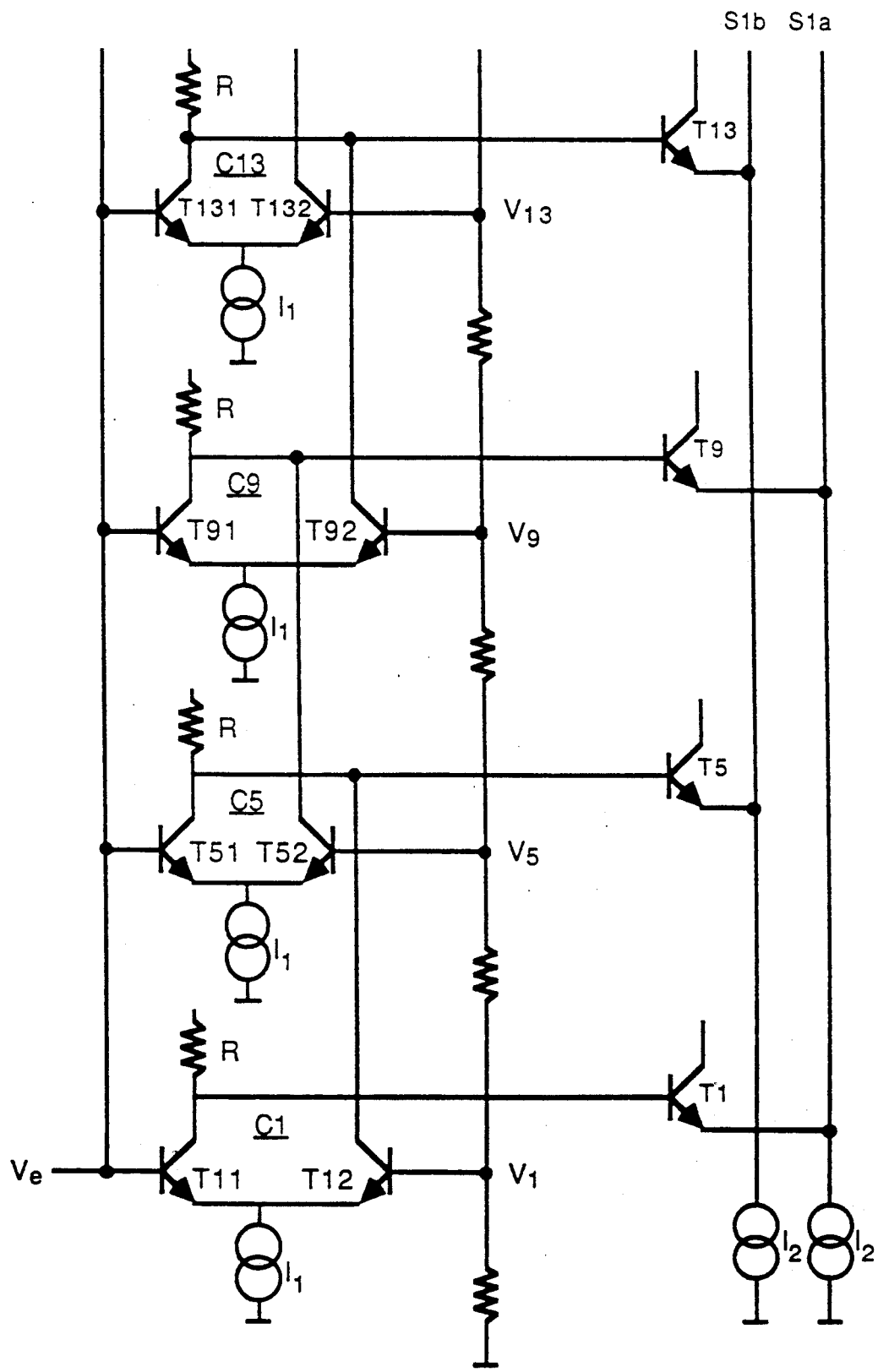
FIG. 2, above described, shows exemplary input comparators associated to a folding combinatory circuit conventionally used in circuits of the type shown in FIG. 1.
Figure 4A:
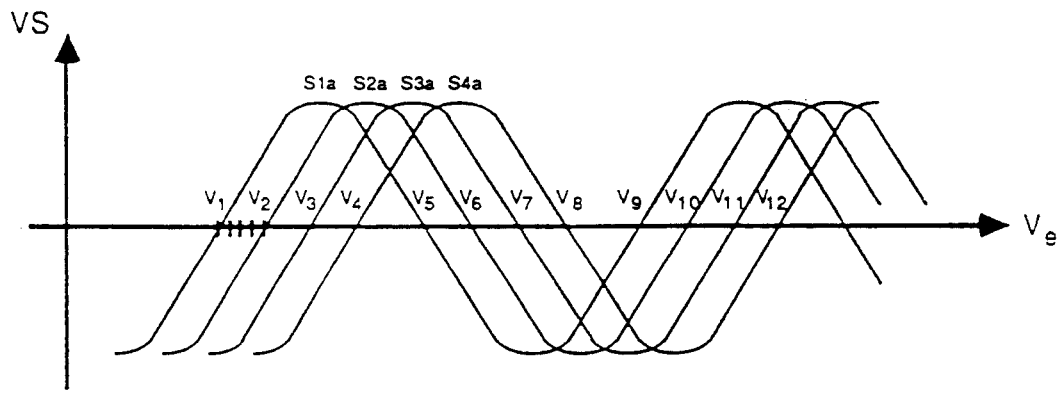
FIG. 4A, above described, schematically shows the overall folded signals obtained at the outputs $s_i$ of the circuit of FIG. 1.
Figure 4B:
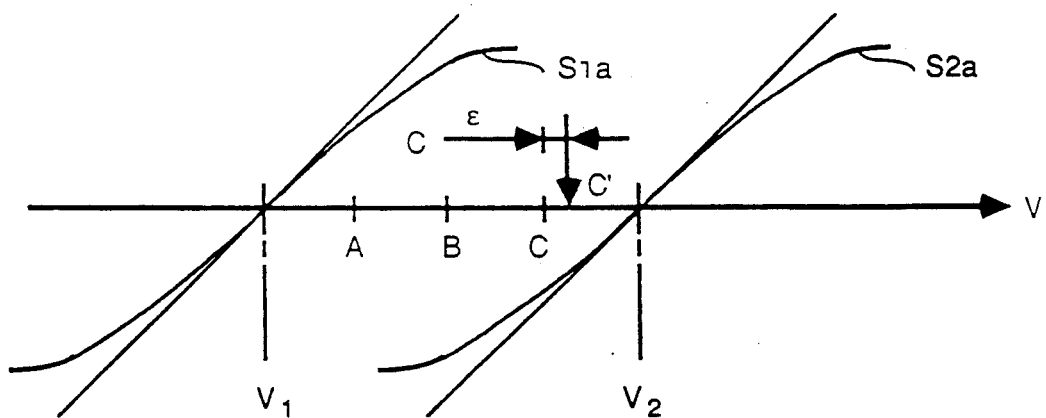
FIG. 4B, above described, shows the waveform of signals of FIGS. 3 and 4A, enlarged to better illustrate their change of state.
Figure 5:
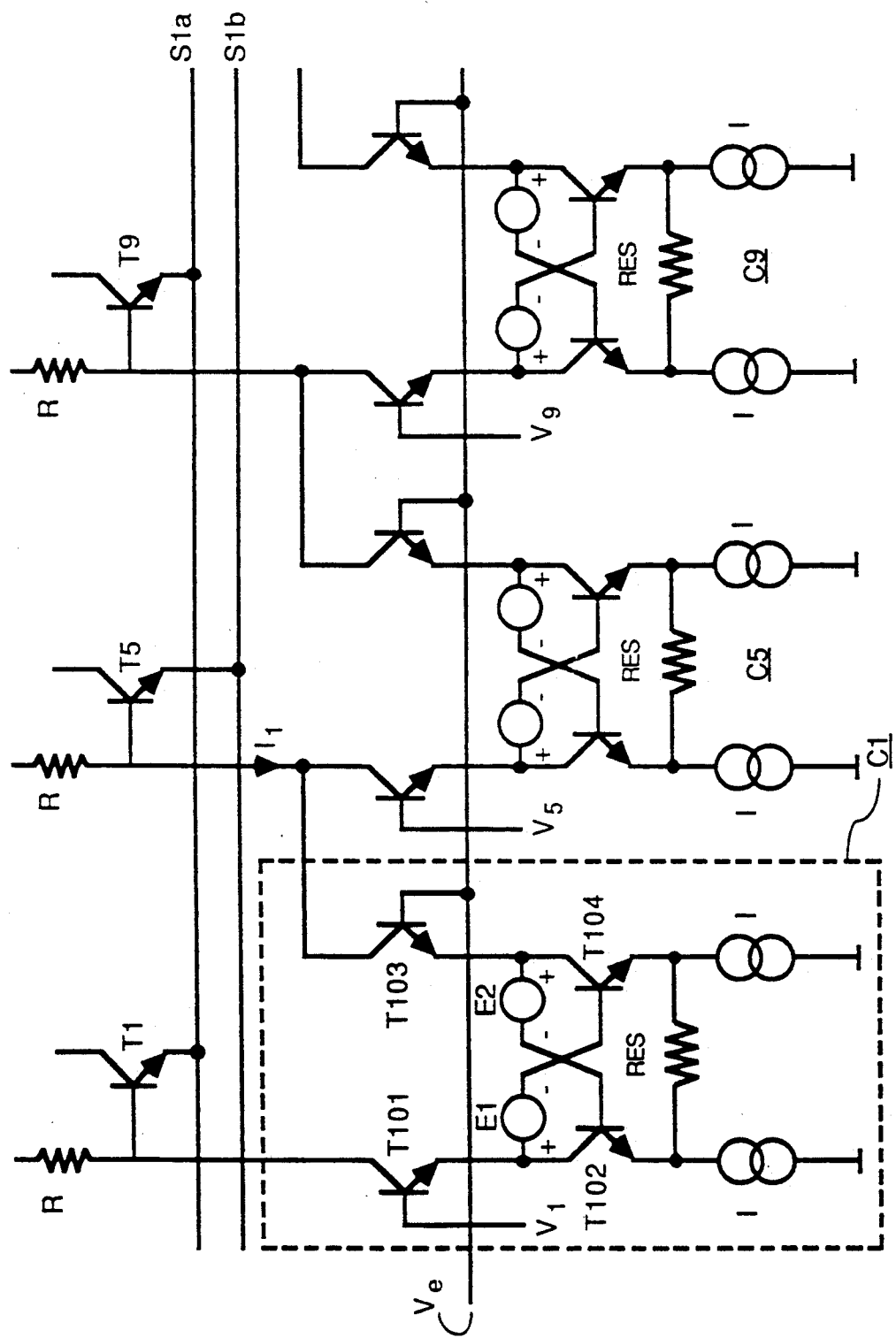
FIG. 5 shows a circuit according to the invention designed to be substituted for the prior art circuit shown in FIG. 2.
Figure 3:
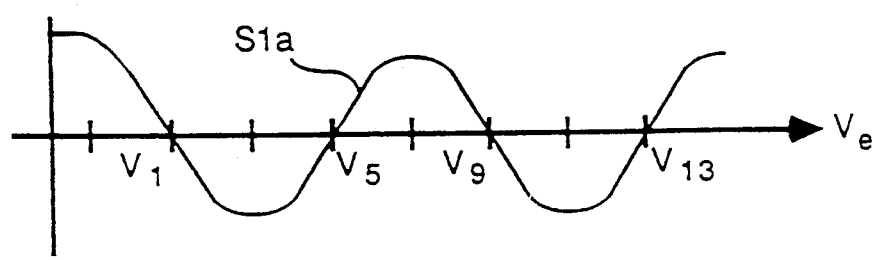
FIG. 3, above described, shows the waveform of a folded signal obtained by the circuit of FIG. 2.

FIG. 5 shows an embodiment of the invention illustrated in a case analogous to that of the prior art above described in relation with FIG. 2. Three comparators $C_1$, $C_5$, $C_9$, complementary output lines $S_{1a}$ and $S_{1b}$ and charging transistors, $T_1$, $T_5$, $T_9$ . . . , of these lines, are shown again.

The difference between the circuit of FIG. 5 and the one of FIG. 2 lies in the structure of comparators $C_1$, $C_5$, $C_9$. The comparators are made so as to have a very linear characteristic close to their switching transition region. Later on, comparator $C_1$ will be described in detail, the other comparators being identical.

Comparator $C_1$ comprises two legs, each of which is connected between a high voltage through a resistor R and a low voltage through a current source I. The first leg comprises in series first and second NPN transistors $T_{101}$ and $T_{102}$. Similarly, the second leg comprises in series third and fourth NPN transistors $T_{103}$ and $T_{104}$. The emitters of transistors $T_{101}$ and $T_{103}$ are connected to the collectors of transistors $T_{102}$ and $T_{104}$, respectively. The emitters of transistors $T_{102}$ and $T_{104}$ are interconnected through a resistor RES. The base of transistor $T_{102}$ is connected to the collector of transistor $T_{104}$ through a voltage shifting means $E_2$ and the base of transistor $T_{104}$ is connected to the collector of transistor $T_{102}$ through a voltage shifting means $E_1$. The input voltage $V_e$ arrives at the base of transistor $T_{103}$ and the reference voltage $V_1$ arrives at the base of transistor $T_{101}$. The first comparator $C_1$ is connected to the next comparator, $C_5$, as illustrated, that is, the collector of the third transistor of a comparator is connected to the collector of the first transistor of the next comparator.

Calculations show that such a comparator is strictly linear close to its switching area, that is, in this area, the current in the collector of transistor $T_{101}$ is equal to $I+(V_e-V_1)/RES$.

Because of the linearity of the characteristics, it is possible to increase the number of interpolations between two reference voltages and therefore to decrease the total number of comparators used in the circuit. This reduction of the number of comparators entails more complex elementary comparators, but those skilled in the art will note that a better end result is obtained with the structure of the invention.

Of course the invention is liable of various variants and modifications which will appear to those skilled in the art.

Figure 6:
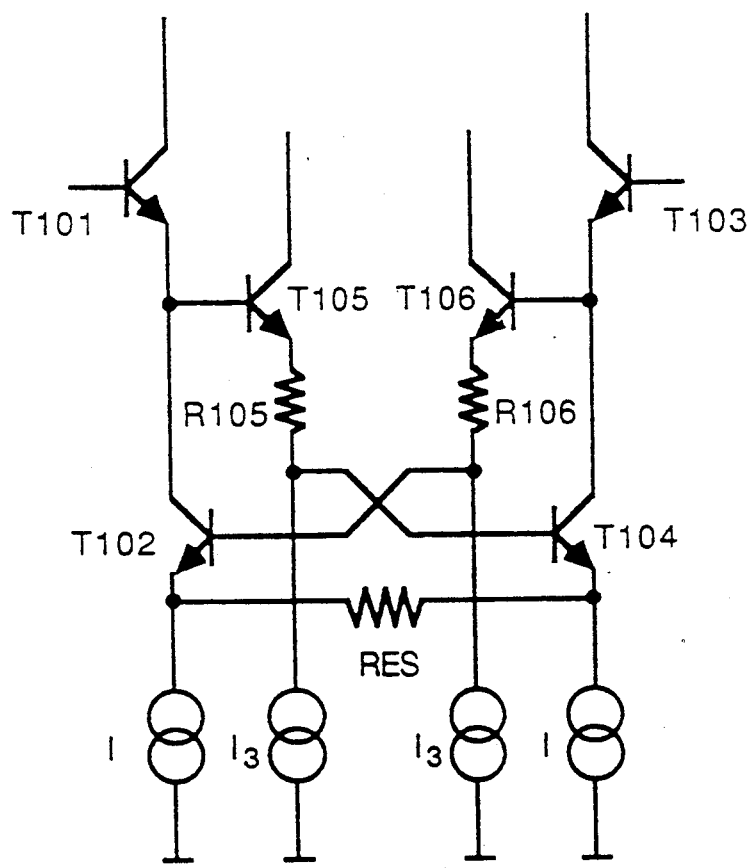
FIG. 6 shows a preferred embodiment of a comparator of FIG. 5.

FIG. 6 shows an exemplary embodiment of the voltage shifting means $E_1$ and $E_2$ of comparator $C_1$. In this figure, reference numerals identical to those of FIG. 5 are used. The voltage shifting means $E_1$ is comprised of a NPN transistor $T_{105}$ and a resistor $R_{105}$. Transistor $T_{105}$ is connected in series with resistor $R_{105}$ and a current source $I_3$ between the high voltage supply terminal and the ground. The base of transistor $T_{105}$ is connected to the junction of transistors $T_{101}$ and $T_{102}$; the resistor terminal $R_{105}$ opposite to transistor $T_{105}$ is connected to the base of transistor $T_{104}$. Transistor $T_{106}$ and resistor $R_{106}$ are symmetrically connected.

I claim:

1. An N-bit interpolation analog/digital circuit comprising a first stage of comparators, the outputs of which are combined into a plurality of groups, wherein a signal periodically varying between high and low levels is formed at the combined output of each group; the output signals of each group being compared, close to their zero crossings, in second stages of comparators, wherein each comparator of the first stage is a high linearity comparator comprising two legs each comprising a first and a second transistor, the base of the second transistor of each leg being connected at the junction node of the transistors of the other leg through a voltage shifting means, and the emitters of the second transistors of each leg being interconnected through a resistor.

2. An interpolation analog-to-digital converter for converting an analog signal to a digital signal, said converter comprising:
    a plurality of input comparators for comparing said analog signal with reference signals, outputs of said input comparators being combined into groups;
    a plurality of interpolation means, each being connected to the corresponding group;
    encoding means connected to outputs of the interpolation means and input comparators for producing the digital signal;
    each input comparator including a first channel for receiving a reference signal, a second channel for receiving said analog signal and voltage shifting means connected between the channels;
    each channel including a first transistor and a second transistor;
    a base of the second transistor of each channel being connected to a junction point of transistors of the other channel through the voltage shifting means.

3. The converter according to claim 2, wherein emitters of the second transistors of each channel are connected through resistor means.

4. The converter according to claim 2, wherein the reference signals are supplied by a stepped resistor bridge.

5. In an analog-to-digital converter having input comparator means for comparing an input analog signal with reference signals, interpolation means connected to a group of said comparator means for interpolating a combined output signal of the group in order to form a plurality of interpolated signals encoding means connected to outputs of the interpolation means and input comparators for producing the digital signal; the improvement comprising:

each of said comparator means having a first circuit for receiving a reference signal, a second circuit for receiving said analog signal and voltage shifting means connected between said first and second circuits, each circuit including a first transistor and a second transistor, a base of the second transistor of each circuit being connected to a junction point of transistors of the other circuit through the voltage shifting means.

6. The converter according to claim 5, wherein emitters of the second transistors of each circuit are connected through resistor means.

7. The converter according to claim 5, wherein the reference signals are supplied by a stepped resistor bridge.

* * * * *